US009958773B2

(12) United States Patent
Okada et al.

(10) Patent No.: US 9,958,773 B2
(45) Date of Patent: May 1, 2018

(54) IMPRINT APPARATUS AND METHOD OF MANUFACTURING ARTICLE

(71) Applicant: CANON KABUSHIKI KAISHA, Tokyo (JP)

(72) Inventors: Tetsuji Okada, Utsunomiya (JP); Noriyasu Hasegawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 259 days.

(21) Appl. No.: 14/683,614

(22) Filed: Apr. 10, 2015

(65) Prior Publication Data

US 2015/0290871 A1    Oct. 15, 2015

(30) Foreign Application Priority Data

Apr. 15, 2014    (JP) .................................. 2014-083989

(51) Int. Cl.
    *G03F 7/00*    (2006.01)
    *G03F 9/00*    (2006.01)

(52) U.S. Cl.
    CPC .......... *G03F 7/0002* (2013.01); *G03F 9/7042* (2013.01)

(58) Field of Classification Search
    CPC .............................. G03F 7/0002; G03F 9/7042
    USPC .......................................... 264/496; 977/887
    See application file for complete search history.

(56) References Cited

U.S. PATENT DOCUMENTS

| 8,562,323 | B2 | 10/2013 | Ito et al. |
| 8,672,661 | B2 * | 3/2014 | Minoda ................. G03F 7/0002 264/293 |
| 8,679,357 | B2 * | 3/2014 | Wakamatsu .......... G03F 7/0002 264/320 |

(Continued)

FOREIGN PATENT DOCUMENTS

| JP | 2007260791 A | 10/2007 |
| JP | 2008244441 A | 10/2008 |

(Continued)

OTHER PUBLICATIONS

Office Action issued in Korean Patent Application No. 10-2015-0052246 dated Aug. 21, 2017.

(Continued)

*Primary Examiner* — Matthew J Daniels
*Assistant Examiner* — Andrew D Graham
(74) *Attorney, Agent, or Firm* — Rossi, Kimms & McDowell LLP

(57) ABSTRACT

The present invention provides an imprint apparatus which forms an imprint material on a substrate using a mold, comprising a driving unit driving at least one of the mold and the substrate, a measurement unit measuring a position deviation amount between the mold and the substrate, and a control unit controlling alignment between the mold and the substrate based on the position deviation amount, wherein in a first period from a start of contact between the mold and the imprint material until a distance between the mold and the substrate falls within a target range, and a second period in which the distance is maintained, the control unit obtains a command value for controlling the driving unit and controls the driving unit such that a amplification factor of the command value in the second period is larger than that in the first period.

14 Claims, 7 Drawing Sheets

(56) References Cited

U.S. PATENT DOCUMENTS

| | | | | |
|---|---|---|---|---|
| 2007/0102838 A1* | 5/2007 | Simon | | G03F 7/0002 264/496 |
| 2010/0270705 A1* | 10/2010 | Okushima | | G03F 7/0002 264/293 |
| 2013/0037981 A1* | 2/2013 | Tanaka | | G03F 7/0002 264/40.5 |
| 2013/0056905 A1* | 3/2013 | Hamaya | | G03F 7/0002 264/293 |
| 2013/0082029 A1* | 4/2013 | Hatogai | | G03F 7/0002 425/385 |
| 2013/0161868 A1* | 6/2013 | Maeda | | G03F 7/0002 264/293 |
| 2013/0300031 A1* | 11/2013 | Torii | | G03F 7/0002 264/293 |
| 2014/0072668 A1* | 3/2014 | Yoneda | | G03F 7/0002 425/385 |
| 2014/0138354 A1* | 5/2014 | Ootera | | G03F 7/0002 264/496 |
| 2014/0166615 A1* | 6/2014 | Kim | | G03F 7/0002 264/496 |
| 2014/0265013 A1* | 9/2014 | Chou | | G03F 7/0002 264/220 |
| 2014/0284846 A1* | 9/2014 | Takekawa | | G03F 7/0002 264/293 |
| 2015/0017275 A1* | 1/2015 | Mitamura | | G03F 7/0002 425/385 |
| 2015/0044417 A1* | 2/2015 | Koike | | G03F 7/0002 264/447 |
| 2015/0048559 A1* | 2/2015 | Kobayashi | | G03F 7/0002 264/496 |
| 2016/0031151 A1* | 2/2016 | Tan | | G03F 7/0002 264/40.5 |
| 2016/0039126 A1* | 2/2016 | Tan | | G03F 7/0002 264/40.5 |

FOREIGN PATENT DOCUMENTS

| | | |
|---|---|---|
| JP | 2012099790 A | 5/2012 |
| KR | 1020090109116 A | 10/2009 |
| KR | 1020120091455 A | 8/2012 |
| WO | 2013137176 A1 | 9/2013 |

OTHER PUBLICATIONS

Notice of Preliminary Rejection issued in Korean Appln. No. 10-2015-0052246 dated Jan. 25, 2017. English translation provided.

Office Action issued in Japanese Appln. No. 2014-083989 dated Jan. 26, 2018.

* cited by examiner

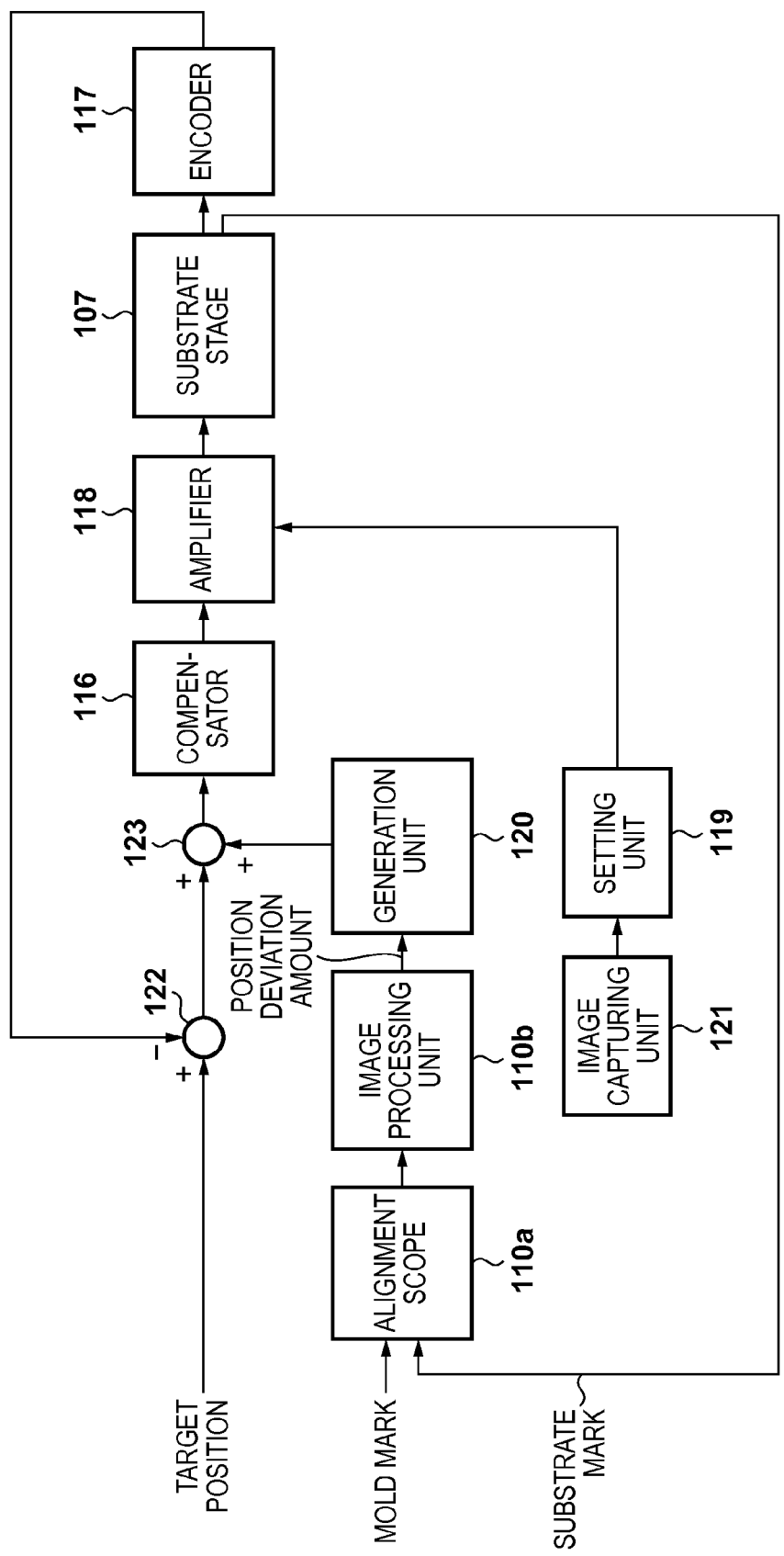

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus which forms an imprint material on a substrate using a mold has received attention as one of lithography apparatuses for mass-producing magnetic storage media and semiconductor devices. The imprint apparatus can form a pattern on the substrate by curing the imprint material supplied onto the substrate in a state in which the imprint material and the mold are in contact with each other, and separating (releasing) the mold from the cured imprint material.

Alignment between the mold and the substrate is generally performed in the imprint apparatus also in the state in which the mold and the imprint material are in contact with each other. At this time, because of the viscoelasticity of the imprint material, it is difficult to change the relative positions of the mold and the substrate in the state in which they are in contact with each other.

Japanese Patent Laid-Open No. 2008-244441 discloses a method of changing a proportional gain for driving a stage in a period when a mold and an imprint material start to contact with each other, and the mold and a substrate are brought close to each other. In a period when the distance between the mold and the substrate becomes constant, the proportional gain may be reduced gradually. Therefore, in a case in which alignment between the mold and the substrate is performed in the period when the distance between the mold and the substrate becomes constant, a time required for the alignment between the mold and the substrate becomes longer if the proportional gain is reduced, resulting in a decrease in throughput.

SUMMARY OF THE INVENTION

The present invention provides an imprint apparatus capable of, for example, reducing a time required for alignment between a mold and a substrate, and increasing throughput.

According to one aspect of the present invention, there is provided an imprint apparatus which forms an imprint material on a substrate using a mold on which an unevenness pattern is formed, the apparatus comprising: a driving unit configured to drive at least one of the mold and the substrate; a measurement unit configured to measure a position deviation amount between the mold and the substrate in a direction parallel to a surface of the substrate; and a control unit configured to control alignment between the mold and the substrate by controlling the driving unit based on the position deviation amount, wherein in a first period from a start of contact between the mold and the imprint material until a distance between the mold and the substrate falls within a target range, and a second period in which the distance is maintained within the target range, the control unit obtains a command value for controlling the driving unit based on the position deviation amount and controls the driving unit such that a amplification factor of the command value with respect to the position deviation amount in the second period is larger than that in the first period.

Further features of the present invention will become apparent from the following description of exemplary embodiments with reference to the attached drawings.

BRIEF DESCRIPTION OF THE DRAWINGS

FIG. 7 is a block diagram showing a control system for alignment between a mold and a substrate.

DESCRIPTION OF THE EMBODIMENTS

Figure 1:
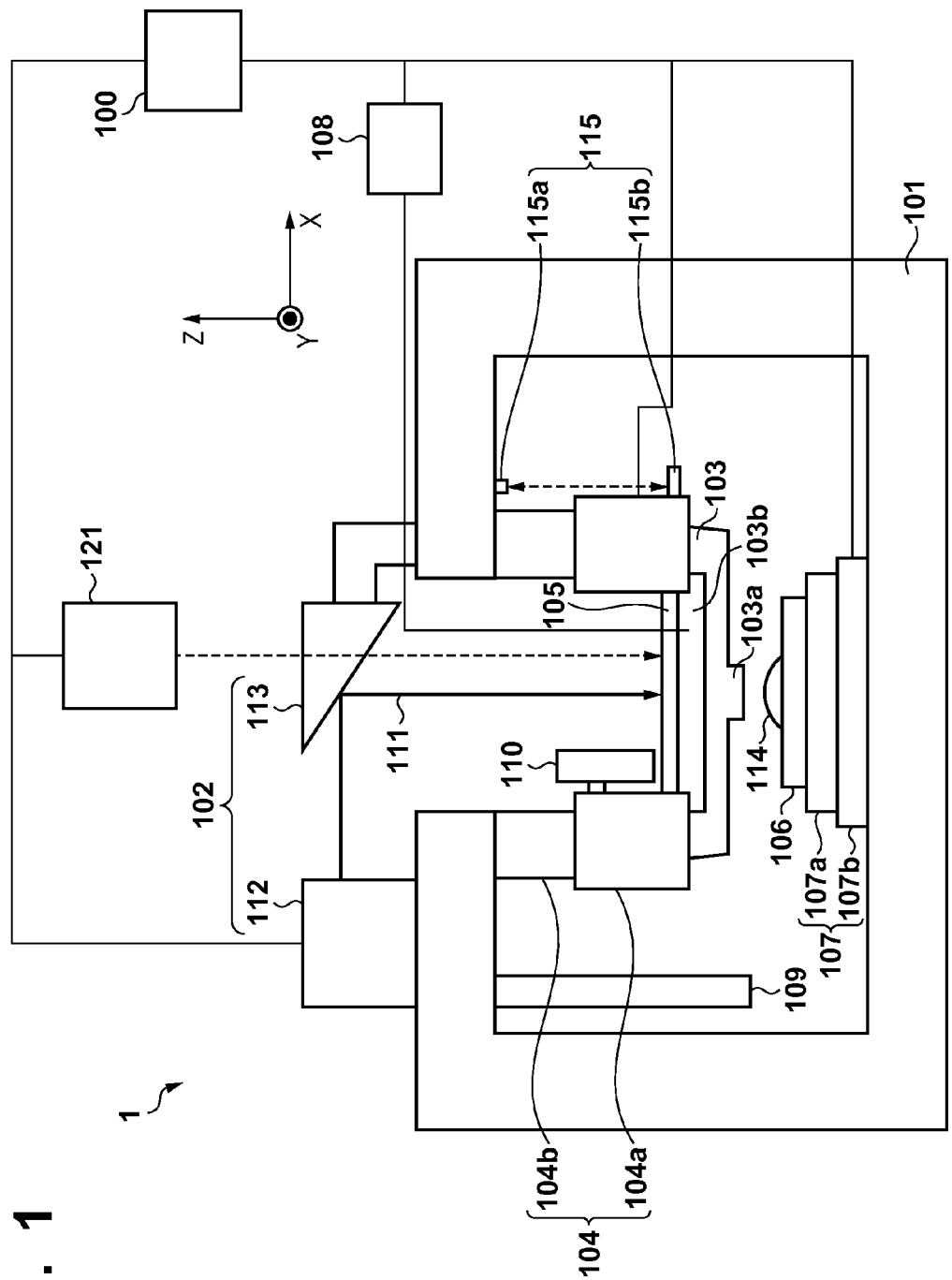
FIG. 1 is a schematic diagram showing an imprint apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An imprint apparatus 1 according to the first embodiment of the present invention will be described. The imprint apparatus 1 is used to manufacture a semiconductor device or the like, and performs an imprint process of forming an imprint material 114 on a substrate using a mold 103 and forming a pattern on the substrate. For example, the imprint apparatus cures the imprint material 114 in a state in which the mold 103, on which the pattern has been formed, is brought into contact with the imprint material 114 on the substrate. Then, the imprint apparatus 1 can form a pattern on the substrate by widening the spacing between the mold 103 and a substrate 106, and separating (releasing) the mold 103 from the cured imprint material 114. A method of curing the imprint material 114 includes a heat cycle method using heat and a photo-curing method using light. In the first embodiment, the imprint apparatus 1 which employs the photo-curing method will be described. The photo-curing method is a method of curing the imprint material 114 by supplying an uncured ultraviolet-curing resin as the imprint material 114 onto the substrate, and irradiating the imprint material 114 with ultraviolet rays 111 in a state in which the mold 103 and the imprint material 114 are in contact with each other.

FIG. 1 is a schematic diagram showing the imprint apparatus 1 according to the first embodiment. The imprint apparatus 1 can include a mold stage 104, a substrate stage 107, a light irradiation unit 102, a supply unit 109, a measurement unit 110, and a control unit 100. The control unit 100 includes, for example, a CPU and a memory, and controls the imprint process (controls the respective units of the imprint apparatus 1). A structure 101 supports the mold stage 104 and the substrate stage 107.

In the imprint process, the light irradiation unit 102 irradiates, through the mold 103, the imprint material 114 on the substrate with light (the ultraviolet rays 111) which cures the imprint material 114. The light irradiation unit 102 can include, for example, a light source 112 and an optical element 113 for guiding light emitted from the light source 112 to the substrate 106. The optical element 113 can include a beam splitter which reflects light (the ultraviolet rays 111) emitted from the light source 112 and transmits light emitted from an image capturing unit 121 to be described later. The optical element 113 may also include a means for adjusting light emitted from the light source 112 to light suitable for the imprint process, such as a liquid crystal element or a digital mirror device. Since the first embodiment employs the photo-curing method, the irradiation unit which emits light is provided. However, when the first embodiment employs, for example, the heat cycle method, a heat source unit configured to cure a thermosetting resin can be provided instead of the light irradiation unit 102.

The mold 103 is normally made of a material such as quartz capable of transmitting ultraviolet rays. An unevenness pattern to be transferred to the substrate 106 is formed in a portion (pattern portion 103a) on a surface on the substrate side. The mold 103 may also include a cavity 103b cylindrically recessed so as to reduce the thickness of the pattern portion 103a and its periphery on a surface on the opposite side of the substrate-side surface. This cavity 103b can be made to have a substantially sealed space by a light-transmitting member 105 provided in the opening region of a mold holding unit 104a to be described later. This space will be referred to as a chamber hereinafter. The chamber is connected to a deformation unit 108 via a pipe. The deformation unit 108 can include a pressure regulator such as a servo valve or a switching valve for switching between a supply source which supplies compressed air to the chamber and a vacuum source which evacuates the chamber to a vacuum. The deformation unit 108 may be provided with the pressure regulating unit capable of regulating a pressure in the chamber and can set the chamber at a predetermined pressure. For example, when bringing the mold 103 and the imprint material 114 on the substrate into contact with each other by reducing the distance between the mold 103 and the substrate 106, the deformation unit 108 applies a force to the mold 103 by making the pressure in the chamber higher than its outside pressure. This allows the deformation unit 108 to deform the pattern portion 103a (pattern) into a convex shape to bend toward the substrate 106 and bring the pattern portion 103a into contact with the imprint material 114 from its central portion. This prevents a gas (air) from being trapped between the imprint material 114 and the concave portion of the pattern of the mold 103. As a result, the imprint material 114 can fill in every corner of the pattern of the mold 103, thus making it possible to prevent loss of the pattern that has been formed in the imprint material 114.

The mold stage 104 can include the mold holding unit 104a which holds the mold by, for example, a vacuum chucking force or an electrostatic force, and a mold driving unit 104b which drives the mold holding unit 104a in a Z direction. Each of the mold holding unit 104a and the mold driving unit 104b has the opening region in its central portion (interior), and is configured so that the substrate 106 is irradiated, through the mold 103, with light from the light irradiation unit 102. The mold driving unit 104b includes an actuator such as a linear motor or an air cylinder, and drives the mold holding unit 104a (mold 103) in the Z direction to bring the mold 103 and the imprint material 114 on the substrate into contact with each other or separate them from each other. Since the mold driving unit 104b is required to perform alignment with high accuracy when the mold 103 and the imprint material 114 on the substrate are brought into contact with each other, it may be formed by a plurality of driving systems including a coarse driving system and a fine driving system. In addition to the function of driving the mold in the Z direction, the mold driving unit 104b may have a position adjustment function of adjusting the position of the mold 103 in X and Y directions and a θ direction (a rotation direction about a Z-axis), a tilt function of correcting the tilt of the mold 103, and the like. For example, the mold driving unit 104b includes a plurality of actuators which drive the mold holding unit 104a (mold 103) in the Z direction, and can control a driving amount and a tilt in a Z-axis direction from the driving amount of each actuator. In the imprint apparatus 1 according to the first embodiment, the mold driving unit 104b performs an operation of changing the distance between the mold 103 and the substrate 106. However, a substrate driving unit 107b of the substrate stage 107 may perform that operation or both of the mold driving unit 104b and the substrate driving unit 107b may relatively perform that operation.

As the substrate 106, for example, a single-crystal silicon substrate or an SOI (Silicon on Insulator) substrate is used. The supply unit 109 supplies the imprint material 114 to the upper surface (processed surface) of the substrate 106.

The substrate stage 107 includes a substrate holding unit 107a and the substrate driving unit 107b, and performs the alignment between the mold 103 and the substrate 106 by moving the mold 103 and the imprint material 114 on the substrate in the X direction and the Y direction when bringing them into contact with each other. The substrate holding unit 107a holds the substrate 106 by, for example, a vacuum chucking force or an electrostatic force. The substrate driving unit 107b mechanically holds the substrate holding unit 107a, and drives the substrate holding unit 107a (substrate 106) in the X direction and the Y direction. As the substrate driving unit 107b, for example, a linear motor may be used. The substrate driving unit 107b may be formed by a plurality of driving systems including a coarse driving system and a fine driving system. Also, the substrate driving unit 107b may have a driving function of driving the substrate 106 in the Z direction, a position adjustment function of adjusting the position of the substrate 106 by rotating the substrate 106 in the θ direction, a tilt function of correcting the tilt of the substrate 106, and the like. In the imprint apparatus 1 according to the first embodiment, the substrate driving unit 107b performs the alignment between the mold 103 and the substrate 106. However, the mold driving unit 104b of the mold stage 104 may perform the alignment or both of the substrate driving unit 107b and the mold driving unit 104b may relatively perform the alignment. That is, at least one of the mold driving unit 104b and the substrate driving unit 107b can perform the alignment between the mold 103 and the substrate 106.

The position of the substrate stage 107 can be measured by using, for example, an encoder including a scale provided in the structure 101, and an optical system which irradiates the surface of the scale with light and receives reflected light from the scale. In the first embodiment, the position of the substrate stage 107 is measured by using the encoder. However, the present invention is not limited to this, and the position of the substrate stage 107 may be measured by using, for example, a laser interferometer. The laser interferometer can, for example, irradiate a reflecting plate provided on the substrate stage 107 with a laser beam, detect a displacement from a reference position on the substrate stage 107 based on the laser beam reflected by the reflecting plate, and measure the position of the substrate stage 107. The position of the mold stage 104 can also be measured by using the encoder or the laser interferometer as in the measurement of the position of the substrate stage 107.

The measurement unit 110 can include, for example, an alignment scope 110a and an image processing unit 110b. The alignment scope 110a includes, for example, a light source, a lens system, and an image sensor, and detects a mark provided on the mold 103 and a mark provided on the substrate 106. Then, the measurement unit 110 performs image processing in the image processing unit 110b on the detection result (an image obtained by the image sensor) of the alignment scope 110a. This allows the measurement unit 110 to obtain the position deviation amount between the mold 103 and the substrate 106 in the directions (X and Y directions) parallel to the surface of the substrate 106. The measurement unit 110 can also measure the relative rotation about the Z-axis between the mold 103 and the substrate 106 by respectively detecting a plurality of marks provided on the mold 103 and a plurality of marks provided on the substrate 106 using the alignment scope 110a. In the first embodiment, the measurement unit 110 includes the image processing unit 110b. However, the present invention is not limited to this, and the control unit 100 may include the image processing unit 110b. The supply unit 109 supplies (coats) the imprint material 114 (uncured resin) onto the substrate. As described above, in the imprint apparatus 1 according to the first embodiment, an ultraviolet-curing resin having a property that is cured upon the irradiation with the ultraviolet rays 111 is used as the imprint material 114.

In the imprint apparatus 1 thus arranged according to the first embodiment, an imprint process of transferring the pattern of the mold 103 to the substrate 106 will be described. The control unit 100 can control the imprint process. First, the control unit 100 controls a substrate conveying mechanism (not shown) to convey the substrate 106 onto the substrate stage 107 and controls the substrate holding unit 107a to hold the substrate 106 (holding step). Next, the control unit 100 controls the substrate stage 107 to arrange the substrate 106 under the supply unit 109. Then, the control unit 100 controls the supply unit 109 to supply the imprint material 114 to a shot region (target shot region), out of a plurality of shot regions formed on the substrate, where the imprint process is to be performed (supplying step). Next, the control unit 100 controls the substrate stage 107 to arrange the target shot region to which the imprint material 114 has been supplied under the pattern portion 103a of the mold 103. After the target shot region is arranged under the pattern portion 103a, the control unit 100 controls the mold stage 104 to bring the mold 103 and the imprint material 114 into contact with each other (imprinting step). When bringing the mold 103 and the imprint material 114 into contact with each other by reducing the distance between the mold 103 and the substrate 106, the control unit 100 controls the deformation unit 108 to deform the pattern portion 103a of the mold 103 into a convex shape to bend toward the substrate 106. Then, after the contact between the mold 103 and the imprint material 114 has begun, the control unit 100 controls the deformation unit 108 (pressure regulator) to reduce the pressure in the chamber, that is, the force applied to the mold 103 as the distance between the mold 103 and the substrate 106 becomes shorter. This allows the pattern portion 103a to gradually change its shape from the convex shape to bend toward the substrate 106 to a plane. It is therefore possible to gradually bring the pattern portion 103a into contact with the imprint material 114 from its central portion to the outside (gradually extend the contact area between the mold 103 and the imprint material 114).

After the whole pattern portion 103a contacts the imprint material 114 by reducing the distance between the mold 103 and the substrate 106, the control unit 100 controls a predetermined time to be elapsed in a state in which the distance between the mold 103 and the substrate 106 is maintained within a target range. This makes it possible to sufficiently fill the concave portion of the pattern of the mold 103 with the imprint material 114. After the concave portion of the pattern of the mold 103 is filled with the imprint material 114, the control unit 100 controls the light irradiation unit 102 to irradiate the imprint material 114 with light (ultraviolet rays 111) and cures the imprint material 114 (curing step). After the imprint material 114 is cured by irradiation with light, the control unit 100 controls the mold stage 104 to increase the distance between the mold 103 and the substrate 106, and separates (releases) the mold 103 from the imprint material 114 on the substrate (releasing step). As a result, the pattern of the imprint material 114 in a three-dimensional shape following the unevenness pattern of the mold 103 is formed in the target shot region on the substrate 106. Such a series of imprint processes are performed on each of the plurality of shot regions formed on the substrate 106.

Figure 2:
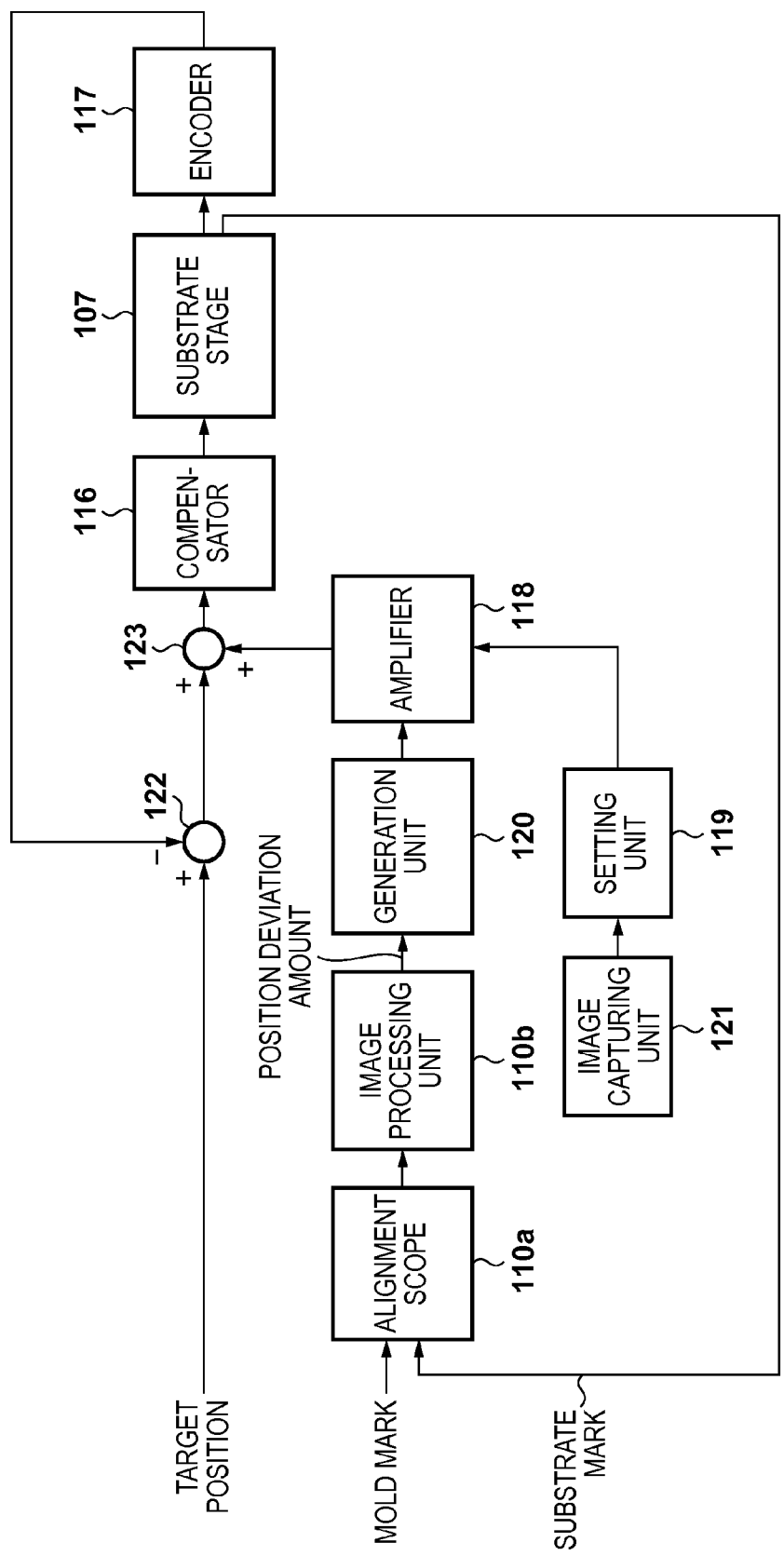
FIG. 2 is a block diagram showing a control system for alignment between a mold and a substrate.

In the imprint apparatus 1 according to the first embodiment, the alignment between the mold 103 and the substrate 106 is performed also in a state (the imprinting step and a filling step) in which the mold 103 and the imprint material 114 are in contact with each other. Control of the alignment between the mold 103 and the substrate 106 will be described with reference to FIG. 2. FIG. 2 is a block diagram showing a control system for the alignment between the mold 103 and the substrate 106. The following description assumes that the control unit 100 includes a compensator 116, a generation unit 120, a setting unit 119, an amplifier 118, a subtracter 122, and an adder 123. The following description also assumes that the alignment between the mold 103 and the substrate 106 according to the first embodiment is performed by driving the substrate stage 107.

In the control system shown in FIG. 2, the subtracter 122 calculates the deviation between the current position and the target position of the substrate stage 107 detected by an encoder 117, and a signal indicating the deviation is supplied to the adder 123. The alignment scope 110a of the measurement unit 110 detects the mark on the mold 103 and the mark on the substrate 106. Then, the image processing unit 110b of the measurement unit 110 performs the image processing on the detection result of the alignment scope 110a, thereby obtaining the position deviation amount between the mold 103 and the substrate 106 in the X and Y directions. The generation unit 120 generates a signal indicating the position deviation amount obtained by the image processing unit 110b. Then, the signal generated by the generation unit 120 is supplied to the adder 123, added to the signal indicating the deviation by the adder 123, and then supplied to the compensator 116. The compensator 116 obtains a command value for driving the substrate stage 107 to bring the position deviation amount between the mold 103 and the substrate 106 close to zero based on the signal indicating the position deviation amount generated by the generation unit 120 and the signal indicating the deviation obtained by the subtracter 122. The command value obtained by the compensator 116 is sent to the substrate driving unit 107b (actuator) of the substrate stage 107. This makes it possible to generate a driving force of the substrate stage 107, and perform the alignment between the mold 103 and the substrate 106 such that the position deviation amount between the mold 103 and the substrate 106 approaches zero.

When forming the pattern by the imprint process, the distance between the mold 103 and the substrate 106 in the state in which the mold 103 and the imprint material 114 are in contact with each other is, for example, as narrow as several ten nm. It is therefore difficult to change the relative positions of the mold 103 and the substrate 106 due to the viscoelasticity of the imprint material 114 in the state in which the mold 103 and the imprint material 114 are in contact with each other. That is, a larger driving force is needed to change the relative positions of the mold 103 and the substrate 106 in the X and Y directions by a predetermined amount in the state in which the mold 103 and the imprint material 114 are in contact with each other than in a state in which they are not in contact with each other. That is, in the case in which the driving force of the substrate stage 107 is not changed, it becomes more difficult to change the relative positions of the mold 103 and the substrate 106 as the contact area between the mold 103 and the imprint material 114 increases, thus decreasing an alignment speed. As a result, a considerable time is required for the alignment between the mold 103 and the substrate 106, thus decreasing throughput. As shown in FIG. 1, the imprint apparatus 1 according to the first embodiment includes the image capturing unit 121 which captures the imprint material 114 through the mold 103. The image capturing unit 121 can capture a state in which the contact area is extended when the imprint material 114 is brought into contact with the mold 103. Also, the amplifier 118 which processes (amplifies) the signal generated by the generation unit 120 and the setting unit 119 which sets the amplification factor of the amplifier 118 are provided for the control system of the imprint apparatus 1. The setting unit 119 in the control unit 100 obtains the contact area between the mold 103 and the imprint material 114 based on the spread of the imprint material 114 obtained from an image captured by the image capturing unit 121. Then, the setting unit 119 sets, in accordance with the obtained contact area, the amplification factor of the amplifier 118 to amplify the signal generated by the generation unit 120 as the contact area increases. This allows the imprint apparatus 1 to increase the driving force of the substrate stage 107 in accordance with the contact area between the mold 103 and the imprint material 114. That is, the imprint apparatus 1 can increase, in the alignment between the mold 103 and the substrate 106, the driving force in a period when the mold 103 and the imprint material 114 are in contact with each other as compared with a period when they are not in contact with each other.

Figure 3:
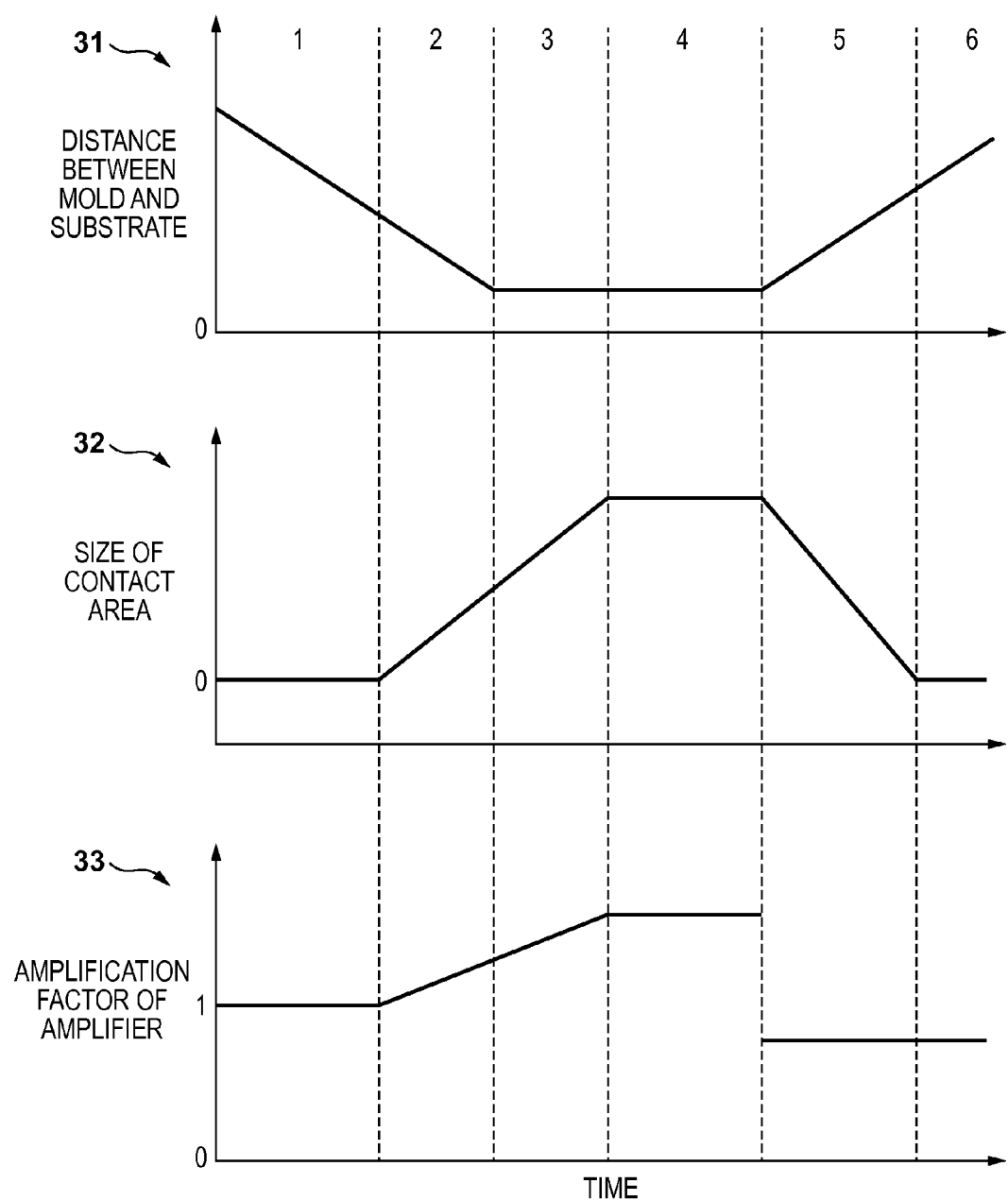
FIG. 3 shows graphs of the amplification factor of an amplifier during an imprint process.

FIG. 3 shows graphs of the amplification factor of the amplifier 118 set by the setting unit 119 during the imprint process. In FIG. 3, 31 represents the distance between the mold 103 and the substrate 106, 32 represents the size of the contact area between the mold 103 and the imprint material 114, and 33 represents the amplification factor of the amplifier 118 set by the setting unit 119.

A period (1) in FIG. 3 is a period in which the mold 103 and the imprint material 114 are not in contact with each other though the distance between the mold 103 and the substrate 106 is reduced gradually. In this period, the contact area between the mold 103 and the imprint material 114 is zero, and thus the setting unit 119 sets the amplification factor of the amplifier 118 to "1". A period (2) in FIG. 3 is a period (a period in which the imprinting step is performed (first period)) from the start of the contact between the mold 103 and the imprint material 114 until the distance between the mold 103 and the substrate 106 falls within the target range. In this period, since the contact area between the mold 103 and the imprint material 114 increases gradually, the setting unit 119 increases the amplification factor of the amplifier 118 as the contact area increases. A period (3) in FIG. 3 is a period (a period in which the filling step is performed (second period)) in which the concave portion of the pattern of the mold 103 is filled with the imprint material 114 in the state in which the distance between the mold 103 and the substrate 106 is maintained within the target range. In this period, although the distance between the mold 103 and the substrate 106 remains unchanged, the imprint material 114 continues to spread between the mold 103 and the substrate 106, and the contact area between the mold 103 and the imprint material 114 increases gradually. Also, the contact area between the mold 103 and the imprint material 114 increases gradually by filling the concave portion of the mold 103 with the imprint material 114. Therefore, the setting unit 119 also increases, in this period, the amplification factor of the amplifier 118 as the contact area increases. The alignment between the mold 103 and the substrate 106 is performed such that the position deviation between the mold 103 and the substrate 106 falls within an allowable range by the end of this period. The amplification factor of the amplifier 118 increases continuously in the periods (2) and (3) in FIG. 3. However, the present invention is not limited to this, and it may be increased stepwise.

A period (4) in FIG. 3 is a period in which the imprint material 114 on the substrate is irradiated with light (ultraviolet rays 111) and cured. In this period, the setting unit can maintain the amplifier 118 with the amplification factor from when the curing of the imprint material 114 starts, that is, when the alignment between the mold 103 and the substrate 106 ends. That is, the control unit 100 can control the substrate stage 107 to maintain the driving force when the curing of the imprint material starts. However, the present invention is not limited to this. For example, the amplification factor may be changed in accordance with a change in the viscoelasticity parameter of the imprint material 114 while the imprint material 114 is cured. A period (5) in FIG. 3 is a period in which the mold 103 is separated from the cured imprint material 114 by increasing the distance between the mold 103 and the substrate 106. In this period, the setting unit 119 reduces the amplification factor of the amplifier 118 when separating the mold 103 and the cured imprint material 114 from each other in order to prevent the unevenness pattern formed on the imprint material 114 from being damaged. The amplification factor of the amplifier 118 may be reduced gradually in accordance with the contact area between the mold 103 and the cured imprint material 114. In this period, for example, the deformation unit 108 can gradually deform the pattern portion 103a of the mold 103 into the convex shape toward the substrate 106 by gradually increasing the pressure in the chamber. By gradually deforming the pattern portion 103a of the mold 103 in the releasing step in this manner, it is possible to easily separate the mold 103 and the imprint material 114 from each other, and prevent the patterns of the mold 103 and the imprint material 114 from being damaged. A period (6) in FIG. 3 is a period in which the mold 103 and the imprint material 114 are not in contact with each other. In this period, since the alignment between the mold 103 and the substrate 106 is not performed, the setting unit 119 sets the amplification factor of the amplifier 118 to be constant.

The amplification factor of the amplifier 118 set by the setting unit 119 in each period during the imprint process will now be described. The setting unit 119 can determine the amplification factor of the amplifier 118 based on an alignment result in the imprint process (test imprint) that has been performed in advance. For example, the control unit 100 performs a test imprint while the amplification factor of the amplifier 118 remains the same. Then, the control unit 100 obtains, by the test imprint, information indicating a change with respect to time in each of the position deviation amount between the mold 103 and the substrate 106, the driving force of the substrate stage 107, and the contact area between the mold 103 and the substrate 106. Next, the control unit 100 obtains, for each sampling time, the spring constant of the imprint material 114 which acts between the mold 103 and the substrate 106 from the position deviation amount between the mold 103 and the substrate 106, and the driving force of the substrate stage 107. Since the substrate stage 107 moves at a low speed in the state in which the mold 103 and the imprint material 114 are in contact with each other, a viscosity resistance rarely occurs but an elasticity characteristic appears in the imprint material. It is therefore possible to obtain the spring constant of the imprint material 114 by dividing the increasing rate of the driving force of the substrate stage 107 by the decreasing rate of the position deviation amount between the mold 103 and the substrate 106. This makes it possible to determine the amplification factor of the amplifier 118 with respect to the contact area between the mold 103 and the imprint material 114 based on the obtained spring constant. The amplification factor of the amplifier 118 can be obtained by a simulation, a theoretical equation, or the like using the spring constant of the imprint material 114 as a parameter in, for example, the control system for the alignment between the mold 103 and the substrate 106.

As described above, the imprint apparatus 1 according to the first embodiment amplifies a signal indicating the position deviation amount between the mold 103 and the substrate 106 when performing the alignment between the mold 103 and the substrate 106 in the imprinting step and the filling step. This makes it possible to increase the driving force of the substrate stage 107 in the state in which the mold 103 and the imprint material 114 are in contact with each other, thus reducing the time required for the alignment and increasing the throughput.

Second Embodiment

An imprint apparatus according to the second embodiment will be described. In the second embodiment, a sensor 115 which measures the distance between a mold 103 and a substrate 106 is provided in an imprint apparatus 1, as shown in FIG. 1. A setting unit 119 obtains the contact area between the mold 103 and an imprint material 114 based on the distance measured by the sensor 115, and sets the amplification factor of an amplifier 118 in accordance with the obtained contact area.

The sensor 115 can include, for example, a laser interferometer 115a fixed on a structure 101. The laser interferometer 115a can emit a laser beam toward a mirror 115b provided in a mold holding unit 104a and obtain the distance between the laser interferometer 115a and the mirror 115b using the laser beam reflected by the mirror 115b. The distance between the laser interferometer 115a and a substrate stage 107 or the substrate 106 in a Z direction, and the distance between the mirror 115b and a pattern portion 103a of the mold 103 are known. Therefore, the sensor 115 can measure the distance between the mold 103 and the substrate 106 by obtaining the distance between the laser interferometer 115a and the mirror 115b. The sensor 115 can also measure the tilt of the mold 103 by arranging the laser interferometers 115a in a plurality of positions in X and Y directions, and measuring the distance between the laser interferometer 115a and the mirror 115b in each of the plurality of positions.

Figure 4:
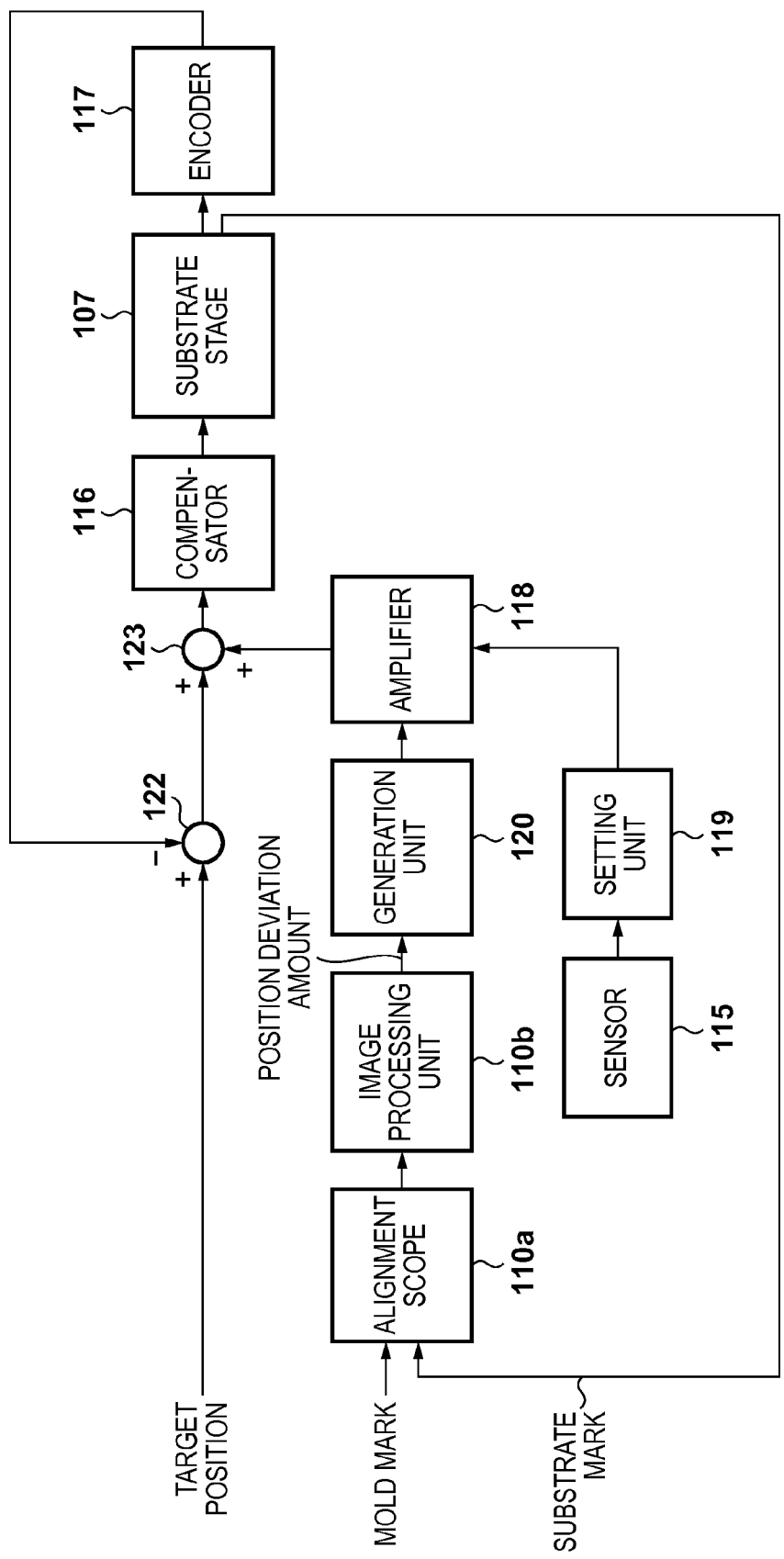
FIG. 4 is a block diagram showing a control system for alignment between a mold and a substrate.

FIG. 4 is a block diagram showing a control system for alignment between the mold 103 and the substrate 106 in the imprint apparatus according to the second embodiment. In the second embodiment, the setting unit 119 obtains the contact area between the mold 103 and the imprint material 114 based on the distance between the mold 103 and the substrate 106 measured by the sensor 115. Then, the setting unit 119 increases the amplification factor of the amplifier 118 in accordance with the obtained contact area. The contact area can be obtained from a measurement result of the sensor 115 by, for example, obtaining the relationship between the contact area and the measurement result of the sensor 115 in advance by an experiment, a simulation, or the like, and using information indicating the relationship. If the relationship of the measurement result of the sensor 115 with respect to the contact area is known in advance, it is possible to increase the amplification factor of the amplifier 118 in accordance with the measurement result of the sensor 115.

Third Embodiment

An imprint apparatus according to the third embodiment will be described. In the third embodiment, a control unit 100 detects a force in a direction (Z direction) perpendicular to the surface of a substrate 106 which is generated between a mold 103 and the substrate 106 by the contact between the mold 103 and an imprint material 114. The force changes in accordance with a contact area and can be detected by, for example, a change in a current value supplied to a mold driving unit 104b to drive the mold 103. Then, a setting unit 119 in the control unit 100 obtains the contact area between the mold 103 and the imprint material 114 based on the detected force, and sets the amplification factor of an amplifier 118 in accordance with the obtained contact area. If the relationship of the current value (the force generated between the mold 103 and the substrate 106) supplied to the mold driving unit 104b with respect to the contact area is known in advance, it is possible to increase the amplification factor of the amplifier 118 in accordance with the current value supplied to the mold driving unit 104b.

Figure 5:
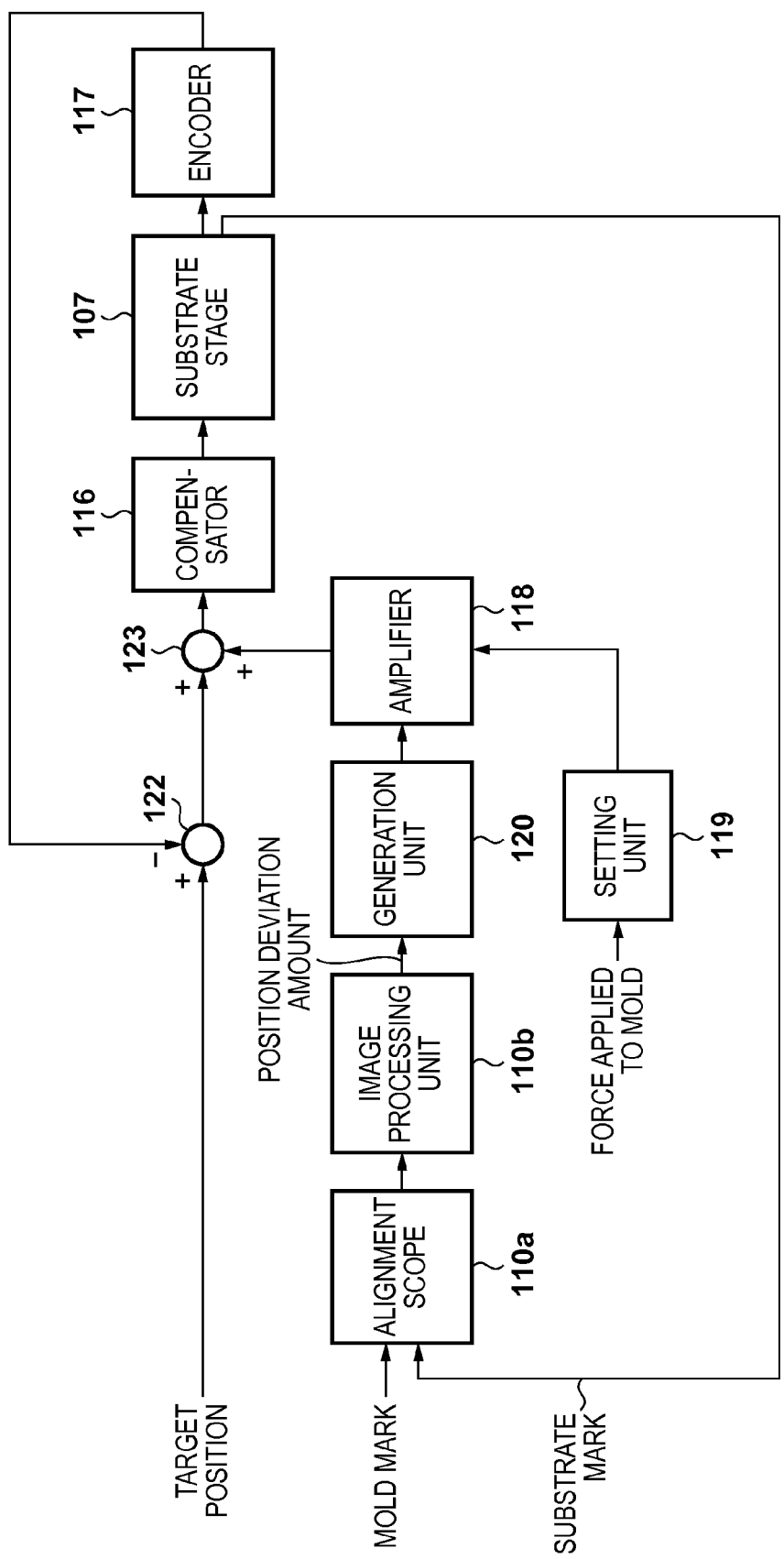
FIG. 5 is a block diagram showing a control system for alignment between a mold and a substrate.

If the distance between the mold 103 and the substrate 106 is reduced gradually, and the mold 103 and the imprint material 114 are brought into contact with each other, the surface tension of the imprint material 114 generates a force between the mold 103 and the substrate 106 in a direction (±Z direction) which brings them close to each other. This force (attractive force) influences the driving forces of a mold stage 104 and a substrate stage 107. Therefore, the control unit 100 detects the attractive force by detecting changes in their driving forces (change in the current value) and determines the amplification factor of the amplifier 118 based on the magnitude the detected attractive force. FIG. 5 is a block diagram showing a control system for alignment between the mold 103 and the substrate 106 in the imprint apparatus according to the third embodiment. In the third embodiment, the setting unit 119 changes the amplification factor of the amplifier 118 in accordance with the detected attractive force. The control unit 100 can, for example, obtain the relationship between the amplification factor and the magnitude of the attractive force in advance by an experiment, a simulation, or the like, and determine the amplification factor of the amplifier 118 using the relationship.

The imprint apparatus according to the third embodiment detects the attractive force generated by the contact between the mold 103 and the imprint material 114 in the Z direction, and obtains the contact area based on the attractive force. However, the present invention is not limited to this. For example, in the alignment between the mold 103 and the substrate 106, a reaction force can be generated between the mold 103 and the imprint material 114 in directions (X and Y directions) parallel to the surface of the substrate 106 in accordance with the contact area between the mold 103 and the imprint material 114. This reaction force influences the driving forces of the mold stage 104 and the substrate stage 107. Therefore, the control unit 100 may detect the reaction force in the X and Y directions by detecting the changes in their driving forces (the change in the current value), and determine the amplification factor of the amplifier 118 based on the magnitude of the detected reaction force. In this case, the control unit 100 can obtain the relationship between the amplification factor and the magnitude of the reaction force in advance by an experiment, a simulation, or the like, and determine the amplification factor of the amplifier 118 using the relationship.

Also, as described above, a deformation unit 108 changes a pressure in a chamber in accordance with the distance between the mold 103 and the substrate 106. Therefore, the control unit 100 may determine the amplification factor of the amplifier 118 based on a force applied to the mold 103 by the deformation unit 108, that is, the pressure in the chamber controlled by the deformation unit 108. In this case, the control unit 100 can, for example, obtain the relationship between the amplification factor and the magnitude of the force applied to the mold 103 by the deformation unit 108 (the value of the pressure in the chamber) in advance by an experiment, a simulation, or the like, and determine the amplification factor of the amplifier 118 using the relationship.

Fourth Embodiment

Figure 6:
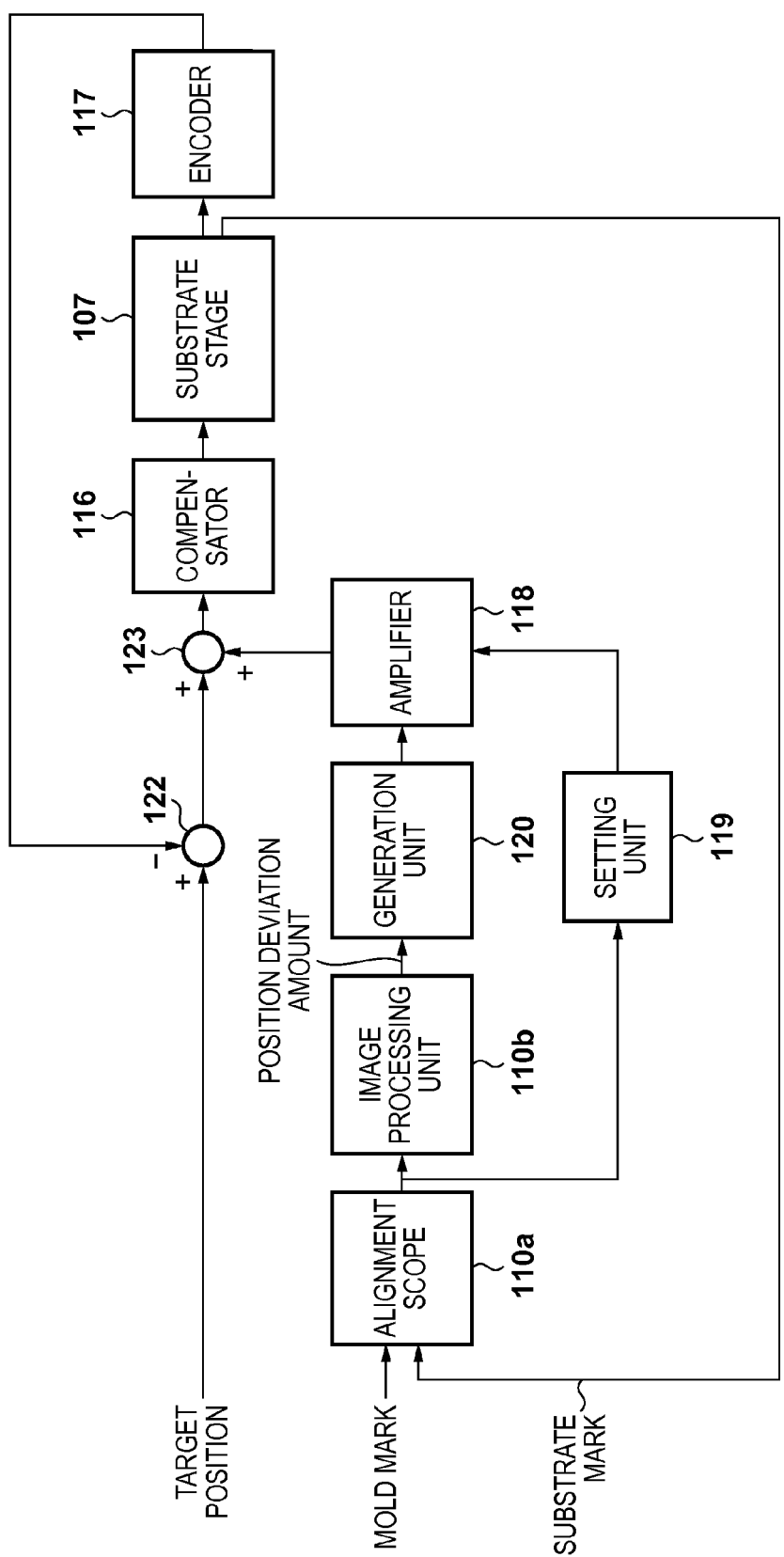
FIG. 6 is a block diagram showing a control system for alignment between a mold and a substrate.

An imprint apparatus according to the fourth embodiment will be described. In the fourth embodiment, a control unit 100 controls an alignment scope 110a of a measurement unit 110 to detect a mark on a mold 103 and a mark on a substrate 106, thereby obtaining the contact area between the mold 103 and an imprint material 114. FIG. 6 is a block diagram showing a control system for alignment between the mold 103 and the substrate 106 in the imprint apparatus according to the fourth embodiment. If the mark provided on the mold 103 is filled with the imprint material 114, the mark on the mold 103 cannot be recognized due to the influence of refraction of light. A plurality of marks are provided on the mold 103. The position of each mark provided on the mold 103 in X and Y directions is known from the design data of the mold 103 or the like. Therefore, when it becomes impossible for the alignment scope 110a to detect the marks on the mold 103, the control unit 100 can obtain the contact area between the mold 103 and the imprint material 114 from the design positions of the marks on the mold 103. In this case, a setting unit 119 can increase the amplification factor of an amplifier 118 in accordance with the obtained contact area.

Fifth Embodiment

An imprint apparatus according to the fifth embodiment will be described with reference to FIG. 7. FIG. 7 is a block diagram showing a control system for alignment between a mold and a substrate in the imprint apparatus according to the fifth embodiment. In the imprint apparatus according to the fifth embodiment, an amplifier 118 is arranged between a compensator 116 and a substrate stage 107, and processes (amplifies) a signal indicating a command value obtained by the compensator 116. For example, the imprint apparatus includes an image capturing unit 121 which captures an imprint material 114 through a mold 103, and a setting unit 119 in a control unit 100 obtains a contact area based on the spread of the imprint material 114 obtained from an image captured by the image capturing unit 121. Then, the setting unit 119 sets, in accordance with the obtained contact area, the amplification factor of the amplifier 118 to amplify the signal indicating the command value obtained by the compensator 116 as the contact area increases. This makes it possible to increase the driving force of the substrate stage 107 in a state in which the mold 103 and the imprint material 114 are in contact with each other, thus reducing a time required for the alignment between the mold 103 and the substrate 106, and increasing throughput.

The imprint apparatus according to the fifth embodiment obtains the contact area from the image captured by the image capturing unit 121 and determines the amplification factor of the amplifier 118 in accordance with the obtained contact area. However, the present invention is not limited to this. For example, as in the second embodiment, if a sensor 115 which measures the distance between the mold and the substrate is provided, the control unit 100 may change the amplification factor of the amplifier 118 in accordance with the distance between the mold 103 and the substrate 106 measured by the sensor 115. Also, as in the third embodiment, the control unit 100 may detect the reaction force in the Z direction, the reaction force in the X and Y directions, and the force applied to the mold by the deformation unit, each of which is generated between the mold 103 and the imprint material 114. In this case, the control unit 100 may change the amplification factor of the amplifier 118 in accordance with these forces.

Any of the above-described embodiments describes an embodiment in which the amplification factor of the amplifier is increased to increase the driving force of the control unit 100. However, the imprint apparatus according to the present invention is not limited to this method. The driving force may be increased by changing the driving profile for driving a mold stage 104 or the substrate stage 107. The driving profile may be not only the position of the stage but also the acceleration, the speed, the driving voltage, or the driving current of the stage. Also, the driving force may be increased by changing a control parameter. For example, if the mold stage 104 or the substrate stage 107 is controlled by PID control (proportional-integral-derivative control), PID parameters (a proportional gain, an integral gain, and a derivative gain) are changed. The control parameters may also include a filter parameter. The driving force can be increased by setting, for example, the order, the frequency, or the like of a filter such as a low-pass filter, bandpass filter, or a notch filter included in the control unit 100.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on a resin supplied to a substrate using the above-described imprint apparatus (a step of performing an imprint process on the substrate) and a step of processing the substrate onto which the pattern has been formed in the preceding step. This manufacturing method further includes other known steps (oxidation, deposition, vapor deposition, doping, planarization, etching, resist peeling, dicing, bonding, packaging, and the like). The method of manufacturing the article according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-083989 filed Apr. 15, 2014, which is hereby incorporated by reference herein in its entirety.

What is claimed is:

1. An imprint apparatus which forms a pattern of an imprint material on a substrate using a mold, the apparatus comprising:
 a driving unit configured to drive at least one of the mold and the substrate;
 a measurement unit configured to measure a position deviation amount between the mold and the substrate in a direction parallel to a surface of the substrate; and
 a control unit configured to control the driving unit based on the measured position deviation amount, in a period for performing alignment between the mold and the substrate before a start of curing the imprint material on the substrate,
 wherein the period includes a first period from a start of contact between the mold and the imprint material until a distance between the mold and the substrate falls within a target range, and a second period in which the distance is maintained within the target range, and
 wherein the control unit is configured to generate a command value for controlling a driving force of the driving unit in the direction parallel to the surface of the substrate, based on the measured position deviation amount, and change an amplification factor to be used to generate the command value such that the amplification factor in the second period is larger than that in the first period.

2. The apparatus according to claim 1, wherein the control unit is configured to increase the amplification factor as a contact area between the mold and the imprint material increases.

3. The apparatus according to claim 1, wherein the control unit is configured to generate the command value by processing a signal indicating the position deviation amount by using the amplification factor.

4. The apparatus according to claim 1, wherein the control unit increases the amplification factor to increase the driving force as a contact area between the mold and the imprint material increases.

5. The apparatus according to claim 2, further comprising an image capturing unit configured to capture an image of the imprint material through the mold,
 wherein the control unit is configured to obtain the contact area based on spread of the imprint material obtained from an image captured by the image capturing unit.

6. The apparatus according to claim 2, wherein the control unit is configured to detect a force generated between the mold and the substrate, and change the amplification factor based on the force which changes in accordance with the contact area.

7. The apparatus according to claim 6, wherein the force generated between the mold and the substrate includes a force generated in a direction perpendicular to the surface of the substrate by bringing the mold and the imprint material into contact with each other.

8. The apparatus according to claim 6, wherein the force generated between the mold and the substrate includes a force generated in a direction parallel to the surface of the substrate in the alignment performed in a state in which the mold and the imprint material are in contact with each other.

9. The apparatus according to claim 1, further comprising a deformation unit configured to deform a pattern surface of the mold into a convex shape to bend toward the substrate by applying a force to the mold,
 wherein after the contact between the mold and the imprint material has begun, the control unit is configured to control the deformation unit to reduce the force applied to the mold as the distance between the mold and the substrate decreases.

10. The apparatus according to claim 9, wherein the control unit is configured to change the amplification factor based on the force applied to the mold by the deformation unit.

11. The apparatus according to claim 1, wherein the control unit is configured to maintain the amplification factor when starting curing of the imprint material while the imprint material is cured.

12. The apparatus according to claim 1, wherein the second period includes a period in which a concave portion of an unevenness pattern of the mold is filled with the imprint material in a state in which the distance is maintained within the target range.

13. The apparatus according to claim 1, wherein the control unit is configured to maintain, while the imprint material is cured, the amplification factor which has been used at an end of the period for performing the alignment.

14. The apparatus according to claim 1, wherein the control unit is configured to reduce the amplification factor when separating the mold and the cured imprint material than that in the period for performing the alignment.

* * * * *